(12) United States Patent
Fumitake

(10) Patent No.: US 9,293,550 B2
(45) Date of Patent: Mar. 22, 2016

(54) SEMICONDUCTOR DEVICE AND MANUFACTURING METHOD THEREOF

(71) Applicant: SEMICONDUCTOR MANUFACTURING INTERNATIONAL CORPORATION (SHANGHAI), Shanghhai (CN)

(72) Inventor: Mieno Fumitake, Shanghai (CN)

(73) Assignee: SEMICONDUCTOR MANUFACTURING INTERNATIONAL (SHANGHAI) CORPORATION (CN)

( * ) Notice: Subject to any disclaimer, the term of this patent is extended or adjusted under 35 U.S.C. 154(b) by 0 days.

(21) Appl. No.: 13/940,095

(22) Filed: Jul. 11, 2013

(65) Prior Publication Data

US 2014/0110778 A1 Apr. 24, 2014

(30) Foreign Application Priority Data

Oct. 19, 2012 (CN) .......................... 2012 1 0398918

(51) Int. Cl.
| | |
|---|---|
| *H01L 29/40* | (2006.01) |
| *H01L 29/423* | (2006.01) |
| *H01L 29/78* | (2006.01) |
| *H01L 21/28* | (2006.01) |
| *H01L 29/49* | (2006.01) |
| *H01L 21/8238* | (2006.01) |
| *H01L 29/66* | (2006.01) |

(52) U.S. Cl.
CPC ...... *H01L 29/4236* (2013.01); *H01L 21/28088* (2013.01); *H01L 21/823807* (2013.01); *H01L 21/823842* (2013.01); *H01L 29/401* (2013.01); *H01L 29/4966* (2013.01); *H01L 29/78* (2013.01); *H01L 29/7845* (2013.01); *H01L 29/66795* (2013.01); *H01L 29/785* (2013.01)

(58) Field of Classification Search
CPC ............ H01L 29/7827; H01L 2924/00; H01L 29/7813; H01L 2224/48247; H01L 29/66734; H01L 29/1095; H01L 29/7395; H01L 27/088; H01L 2924/00014; H01L 29/407; H01L 29/66666; H01L 29/78; H01L 29/41766; H01L 29/4236; H01L 29/0696; H01L 29/66621; H01L 29/42376; H01L 27/10876; H01L 21/823437
USPC ..................... 257/33, 330; 438/589
See application file for complete search history.

(56) References Cited

U.S. PATENT DOCUMENTS

| | | | | |
|---|---|---|---|---|
| 8,441,033 B2 * | 5/2013 | Yamakawa | ...... | H01L 21/823807 257/190 |
| 8,860,135 B2 * | 10/2014 | Hsu et al. | ...................... | 257/337 |

(Continued)

FOREIGN PATENT DOCUMENTS

CN 102903741 1/2013

*Primary Examiner* — Monica D Harrison
(74) *Attorney, Agent, or Firm* — Innovation Counsel LLP

(57) ABSTRACT

The present invention discloses a semiconductor device and a method for manufacturing the semiconductor device. The semiconductor device includes a gate insulating layer formed on an inner wall of a substrate recess, a work function material layer formed on the gate insulating layer so as to apply a tensile stress or a compressive stress to a channel of a MOS field-effect transistor, and a gate metal formed on the work function material layer. The method for manufacturing the semiconductor device includes forming a work function material layer on a gate insulating layer so as to apply a tensile stress or a compressive stress to a channel of a MOS field-effect transistor, wherein the gate insulating layer is formed on an inner wall of a substrate recess, and depositing a gate metal on the work function material layer.

20 Claims, 12 Drawing Sheets

(56) References Cited

U.S. PATENT DOCUMENTS

| | | |
|---|---|---|
| 2009/0315114 A1 | 12/2009 | Rakshit et al. |
| 2010/0276768 A1 | 11/2010 | Gaidis |
| 2011/0147804 A1 | 6/2011 | Mehandru et al. |
| 2013/0126976 A1* | 5/2013 | Yu et al. .................. 257/369 |
| 2013/0240996 A1* | 9/2013 | Yin ................ H01L 21/823842 257/368 |
| 2014/0001543 A1* | 1/2014 | Kim ................ H01L 29/66636 257/330 |

\* cited by examiner

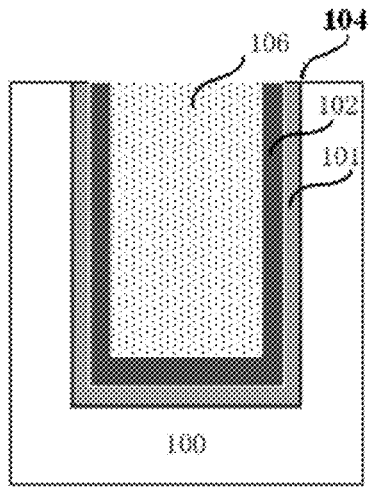

Fig. 1

| Forming a work function material layer on a gate insulating layer such that said work function material layer is capable of applying a tensile stress or a compressive stress to a channel, wherein said gate insulating layer is formed on an inner wall of a substrate recess from which a dummy gate is removed | S201 |
|---|---|
| Depositing a gate metal on said work function material layer | S202 |

Fig. 2

| Forming a gate insulating layer on the inner wall of the substrate recess | S301 |
|---|---|
| Depositing, on said work function material layer, a gate metal capable of applying a tensile stress to a channel | S302 |

Fig. 3

SEMICONDUCTOR DEVICE AND MANUFACTURING METHOD THEREOF

CROSS-REFERENCE TO RELATED APPLICATIONS

This application claims priority to Chinese Patent Application No. 201210398918.7 filed with SIPO on Oct. 19, 2012 and entitled "Semiconductor Device and Manufacturing Method thereof", which is incorporated herein by reference in its entirety.

FIELD OF THE INVENTION

The present disclosure relates to the field of semiconductor technology, and more particularly to a semiconductor device and method for manufacturing the same.

DESCRIPTION OF THE RELATED ART

Advance developments in the field of semiconductor technology have resulted in continuous reductions in the size of the MOSFET (Metal-Oxide-Semiconductor Field-Effect Transistor). However, a reduction in MOSFET size also leads to a corresponding decrease in carrier mobility. The issue of decreased carrier mobility has attracted significant attention in the semiconductor industry, and numerous techniques for increasing the carrier mobility of MOSFETs have been proposed.

In some techniques, the carrier mobility may be increased by applying a stress to a channel region of a MOSFET. For example, the carrier mobility of a pMOSFET (p-type metal-oxide-semiconductor field-effect transistor) may be increased using a silicon germanium (SiGe) channel, which induces a stress in the channel region of the pMOSFET. The SiGe channel may be formed by implanting germanium (Ge) ions into source and drain regions of the silicon (Si) substrate of the pMOSFET. However, currently it has not been verified yet whether or not SiC channel region can enhance carrier mobility of an n-type metal-oxide-semiconductor field-effect transistor (nMOSFET).

In other techniques, the carrier mobility in a channel of a MOSFET may be increased by forming a metal thin film in the channel and performing ion implantation such that the metal thin film applies a compressive stress to the channel. Alternatively, filling bulk metal into the channel (for example, filling p-type bulk metal into a p-type channel or n-type bulk metal into an n-type channel) may also result in a compressive stress or a tensile stress being applied to the channel. Similarly, filling a gate with a metal may also apply stress to the channel and increase carrier mobility.

SUMMARY

The present disclosure is directed to address at least one of the problems relating to decreased carrier mobility in a MOSFET.

In some embodiments of the present disclosure, the carrier mobility of a channel of a MOSFET may be increased by filling a gate structure of the MOSFET with materials that apply stress to the channel.

According to some embodiments of the present disclosure, a semiconductor device is provided, comprising a gate insulating layer formed on an inner wall of a substrate recess, a work function material layer formed on the gate insulating layer so as to apply a tensile stress or a compressive stress to a channel of a MOS field-effect transistor, and a gate metal formed on the work function material layer.

In some embodiments, the semiconductor device may include a gate structure of an nMOS field-effect transistor, and the work function material layer may include a first work function material layer for applying a tensile stress to a channel of the nMOS field-effect transistor.

In some embodiments, the semiconductor device may include a gate structure of a pMOS field-effect transistor, and the work function material layer may include a second work function material layer for applying a compressive stress to a channel of the pMOS field-effect transistor.

In some embodiments, the semiconductor device may include a barrier layer formed between the work function material layer and the gate metal, and a second metal layer formed on a surface common to the work function material layer, the barrier layer, and the gate metal.

In some embodiments, the gate metal may be formed so as to apply a tensile stress to the channel.

In some embodiments, the work function material layer may include a work function material layer for an nMOS field-effect transistor, and the work function material layer may include TiAlN, a metal carbide, or a metal oxycarbide.

In some embodiments, the work function material layer may include a work function material layer for a pMOS field-effect transistor, and the work function material layer may include TiN or Ta compounds.

In some embodiments, the second metal layer may include TiAlN, TiAl, Al, Ti, or TiW, and the gate metal may include W or TiW.

In some embodiments, the semiconductor device may include a protection layer formed between the gate insulating layer and the work function material layer so as to protect the gate insulating layer.

According to some other embodiments of the present disclosure, a method for manufacturing a semiconductor device is provided, the method comprising forming a gate insulating layer on an inner wall of a substrate recess of a MOS field-effect transistor, forming a work function material layer on the gate insulating layer so as to apply a tensile stress or a compressive stress to a channel of the MOS field-effect transistor, and depositing a gate metal on the work function material layer.

In some embodiments, the semiconductor device may include a gate structure of an nMOS field-effect transistor, and the method of manufacturing the semiconductor device may include forming the work function material layer so as to apply a tensile stress to a channel of the nMOS field-effect transistor.

In some embodiments, the semiconductor device may include a gate structure of a pMOS field-effect transistor, and the method of manufacturing the semiconductor device may include forming the work function material layer so as to apply a compressive stress to a channel of the pMOS field-effect transistor.

In some embodiments, the semiconductor device may include a gate structure of a CMOS field-effect transistor, and the substrate recess of the CMOS field-effect transistor may include a first recess for a pMOS field-effect transistor and a second recess for an nMOS field-effect transistor.

In some embodiments, forming the work function material layer on the gate insulating layer may include forming a first work function material layer for the pMOS field-effect transistor on respective gate insulating layers of the first recess and the second recess so as to apply a compressive stress to the channel, etching off an upper portion of the first work function material layer in the first recess and the first work function material layer in the second recess, and forming a second work function material layer for the nMOS field-effect transistor in the first recess and the second recess so as to apply a tensile stress to the channel.

In some embodiments, forming the work function material layer on the gate insulating layer may include depositing a first work function material on the gate insulating layer, and performing ion implantation on the first work function material so as to increase the applied compressive stress.

In some embodiments, the gate metal is formed so as to apply a tensile stress to the channel.

In some embodiments, the method of manufacturing the semiconductor device may include depositing a barrier layer between the work function material layer and the gate metal, removing a portion of the work function material layer, the barrier layer, and the gate metal, forming a second metal layer on a surface common to the work function material layer, the barrier layer, and the gate metal so as to reduce contact resistance, and depositing an insulator on the gate insulating layer and the second metal layer.

In some embodiments, forming the work function material layer on the gate insulating layer may include forming a protection layer on the gate insulating layer, and forming the work function material layer on the protection layer.

According to some other embodiments of the present disclosure, a method for manufacturing a semiconductor device having a gate structure of an nMOS field-effect transistor is provided, the method comprising forming a gate insulating layer on an inner wall of a substrate recess of the nMOS field-effect transistor, forming a work function material layer on the gate insulating layer, and depositing a gate metal on the work function material layer so as to apply a tensile stress to a channel of the nMOS field-effect transistor.

In some embodiments, forming the work function material layer on the gate insulating layer may include forming a protection layer on the gate insulating layer, and forming the work function material layer on the protection layer.

Further features of the present disclosure will be apparent based on the following detailed description of various embodiments with reference to the accompanying drawings.

BRIEF DESCRIPTION OF THE DRAWINGS

FIG. 1 shows a cross-sectional view of a semiconductor device according to an embodiment of the present disclosure.

FIG. 2 shows a flowchart of a method for manufacturing the semiconductor device of FIG. 1 according to an embodiment of the present disclosure.

FIG. 3 shows a flowchart of a method for manufacturing the semiconductor device of FIG. 1 according to another embodiment of the present disclosure.

DESCRIPTION OF THE EMBODIMENTS

Figure 4A:
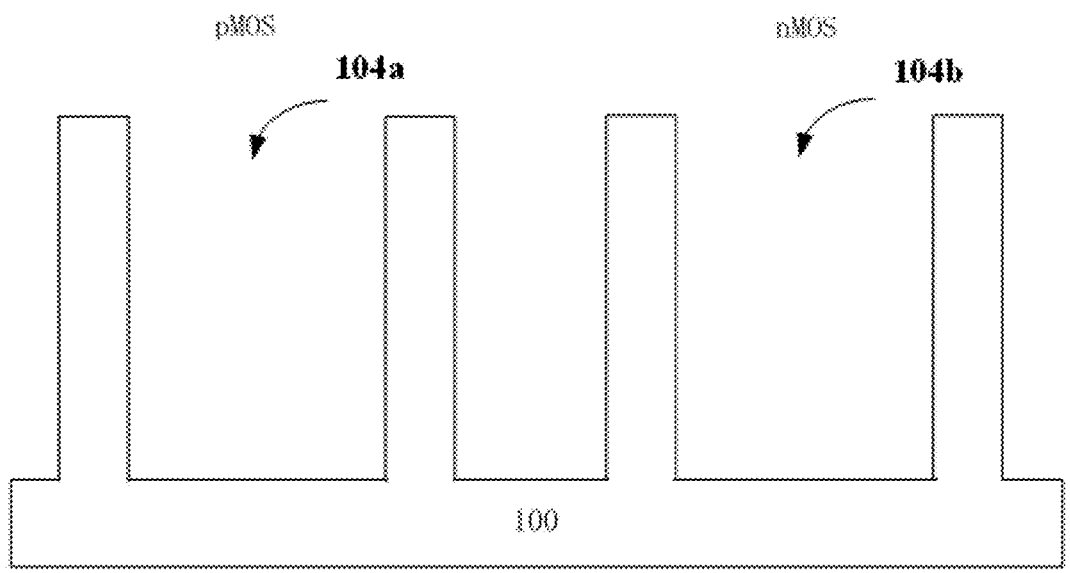
FIGS. 4A-4L show cross-sectional views of various stages of a method for manufacturing a semiconductor device according to an embodiment of the present disclosure.

In the present disclosure, the term "semiconductor device" refers to a device having one or more semiconductor materials. The device may include a manufactured semiconductor device product and/or an intermediate semiconductor device product formed during a manufacturing or machining process.

FIG. 1 shows a cross-sectional view of a semiconductor device according to an embodiment of the present disclosure.

As shown in FIG. 1, the semiconductor device includes a gate insulating layer 101 formed on an inner wall of a recess 104 of a substrate 100, a work function material layer 102 formed on the gate insulating layer 101, and a gate metal 106 formed on the work function material layer 102 and filling the recess 104. The gate insulating layer 101, the work function material layer 102, and the gate metal 106 may be formed in the order as stated above.

The recess 104 may be, for example, a recess formed in the substrate 100 after removal of a dummy gate previously formed in the recess 104.

In some embodiments, the work function material layer 102 may apply a tensile stress and/or a compressive stress to a channel of a MOSFET in the semiconductor device. In other embodiments, the gate metal 106 may apply a tensile stress to the channel. In some other embodiments, the work function material layer 102 and the gate metal 106 may be combined to apply a tensile stress and/or a compressive stress to the channel.

In some embodiments, the gate insulating layer 101 may be formed of a high-k material. The high-k material generally refers to a material having a dielectric constant k greater than 2.5, and may include HfO, HfZrO, HfSiON, or HfLaO. The gate insulating layer 101 may be formed using deposition methods such as chemical vapour deposition (CVD). In some embodiments, the gate insulating layer 101 may be formed after removal of a dummy gate previously formed in the recess 104. In other embodiments, the gate insulating layer 101 may be formed prior to the formation of the dummy gate in the recess 104, such that the gate insulating layer 101 is exposed after the removal of the dummy gate from the recess 104.

In some embodiments, the semiconductor device may include a gate structure of an nMOS field-effect transistor or a gate structure of a pMOS field-effect transistor. In other embodiments, the semiconductor device may include gate structures of a complementary metal oxide semiconductor (CMOS) field-effect transistor, which include a gate structure of an nMOS field-effect transistor and a gate structure of a pMOS field-effect transistor. Depending on the type of gate structures in the semiconductor device, the recess 104 may include a first recess 104a for a pMOS field-effect transistor and/or a second recess 104b for an nMOS field-effect transistor. (See, e.g., FIG. 4A).

In some embodiments, if the semiconductor device includes a gate structure of a pMOS field-effect transistor (wherein the recess 104 includes a first recess 104a for the pMOS field-effect transistor), the work function material layer 102 may constitute a first work function material layer 102a. The first work function material layer 102a includes a work function material for the pMOS field-effect transistor, and the work function material may include, for example, TiN or Ta compounds. In some embodiments, the first work function material layer 102a may apply a compressive stress to a channel of the pMOS field-effect transistor.

The first work function material layer 102a may be formed, for example, using deposition methods such as chemical vapour deposition (CVD) or atomic layer deposition (ALD).

In forming the first work function material layer 102a (for example, TiN) using CVD, the TiN may be deposited using gases such as $H_2$, $N_2$, Ar, or $TiCl_4$, at a pressure of 300 Pa and temperature of 500° C. At these deposition conditions, an exemplary flow rate of the $H_2$ may be 48 sl/h (standard liter per hour), an exemplary flow rate of the $N_2$ may be 24 sl/h, an exemplary flow rate of the Ar may be 1.8 sl/h, and an exemplary flow rate of the TiCl$_4$ may be 6.6 sl/h.

In forming the first work function material layer 102a (for example, TiN) using ALD, the TiN may be deposited using gases such as NH$_3$ or TiCl$_4$, at a pressure of 0.1 Torr and temperature of 450° C.

In the above embodiments, the work function material layer 102 (i.e., the first work function material layer 102a deposited using CVD or ALD) of the pMOS field-effect transistor may apply a compressive stress to the channel of the pMOS field-effect transistor, thereby increasing carrier mobility of the channel of the pMOS field-effect transistor. Additionally, by locating the work function material layer 102 close to the channel of the pMOS field-effect transistor, the compressive stress can be effectively applied to the channel of the pMOS field-effect transistor.

In some embodiments, if the semiconductor device includes a gate structure of an nMOS field-effect transistor (wherein the recess 104 includes a second recess 104b for the nMOS field-effect transistor), the work function material layer 102 may constitute a second work function material layer 102b. The second work function material layer 102b includes a work function material for the nMOS field-effect transistor, and the work function material may include, for example, TiAlN, a metal carbide, or a metal oxycarbide. In some embodiments, the second work function material layer 102b may apply a tensile stress to a channel of the nMOS field-effect transistor. The second work function material layer 102b may be formed, for example, using deposition methods such as chemical vapour deposition (CVD) or atomic layer deposition (ALD).

In forming the second work function material layer 102b (for example, TiAlN) using CVD, the TiAlN may be deposited using gases such as TiCl$_4$, NH$_3$, N$_2$, or TMA (Trimethylamine), at a pressure of 2660 Pa and temperature of 680° C. At these deposition conditions, an exemplary flow rate of the TiCl$_4$ may be 40 sccm (standard cubic centimeters per minute), an exemplary flow rate of the NH$_3$ may be 60 sccm, an exemplary flow rate of the N$_2$ may be 3000 sccm, and an exemplary flow rate of the TMA may be 10 sccm.

In forming the second work function material layer 102b (for example, TiC) using CVD, the TiC may be deposited using gases such as TiCl$_4$ and C$_3$H$_8$, at a pressure of 1000 Pa and temperature of 560° C. At these deposition conditions, an exemplary flow rate of the TiCl$_4$ may be 40 sccm, and an exemplary flow rate of the C$_3$H$_8$ may be 200 sccm.

In the above embodiments, the work function material layer 102 (i.e., the second work function material layer 102b deposited using CVD or ALD) of the nMOS field-effect transistor may apply a tensile stress to the channel of the nMOS field-effect transistor, thereby increasing carrier mobility of the channel of the nMOS field-effect transistor. Additionally, by locating the work function material layer 102 close to the channel of the nMOS field-effect transistor, the tensile stress can be effectively applied to the channel of the nMOS field-effect transistor.

In some embodiments, if the semiconductor device includes both a gate structure of an nMOS field-effect transistor and a gate structure of a pMOS field-effect transistor (wherein the recess 104 includes a first recess 104a for the pMOS field-effect transistor and a second recess 104b for the nMOS field-effect transistor), the work function material layer 102 may include a first work function material layer 102a and a second work function material layer 102b.

In some embodiments, the gate metal 106 may be formed so as to apply a tensile stress to the channel of the nMOS field-effect transistor. The gate metal 106 may be formed of, for example, W or TiW. The gate metal 106 may be formed using deposition methods such as chemical vapour deposition (CVD) or atomic layer deposition (ALD).

In forming the gate metal 106 (for example, W) using CVD, the W may be deposited using gases such as WF$_6$, SiH$_4$ or H$_2$, at a pressure of 0.05-0.3 Torr and temperature of 250-600° C. In this embodiment, the work function material layer 102 may be formed as being of a low stress. In the above embodiments, the gate metal 106 may apply a tensile stress to the channel of the nMOS field-effect transistor, thereby increasing carrier mobility of the channel of the nMOS field-effect transistor.

In a semiconductor device having a work function material layer 102 that includes a first work function material layer 102a and a second work function material layer 102b, the work function material layer 102 may apply a tensile stress and/or a compressive stress to the channels formed between the gate insulating layer and the gate metal, so as to increase the carrier mobilities of the respective channels of the nMOS field-effect transistor and/or the pMOS field-effect transistor. Additionally, a gate metal for applying a tensile stress to the channel of the nMOS field-effect transistor may be formed on the gate insulating layer and the work function material layer, so as to increase the carrier mobility of the nMOS field-effect transistor.

FIG. 2 shows a flowchart of a method for manufacturing the semiconductor device of FIG. 1 according to an embodiment of the present disclosure. As shown in FIG. 2, the method for manufacturing the semiconductor device of FIG. 1 may include the following steps.

At step S201, the gate insulating layer 101 is formed on the inner wall of the substrate recess 104, and the work function material layer 102 is formed on the gate insulating layer 101.

At step S202, the gate metal 106 is deposited on the work function material layer 102.

In the example of FIG. 2, the work function material layer 102 may apply a tensile stress and/or a compressive stress to the channels formed between the gate insulating layer 101 and the gate metal 106, so as to increase the carrier mobilities of the respective channels of a pMOS field-effect transistor and/or nMOS field-effect transistor.

FIG. 3 shows a flowchart of a method for manufacturing the semiconductor device of FIG. 1 according to another embodiment of the present disclosure. As shown in FIG. 3, the method for manufacturing the semiconductor device of FIG. 1 may include the following steps.

At step S301, the gate insulating layer 101 is formed on the inner wall of the substrate recess 104, and the work function material layer 102 is formed on the gate insulating layer 101.

At step S302, the gate metal 106 is deposited on the work function material layer 102.

In the example of FIG. 3, the gate metal 106 may apply a tensile stress to the channel formed between the gate insulating layer 101 and the work function material layer 102, so as to increase carrier mobility of an nMOS field-effect transistor.

The cross-sectional views of FIGS. 4A-4L illustrate a method for manufacturing a semiconductor device according to an embodiment of the present disclosure. The semiconductor device of FIGS. 4A-4L includes a gate structure of an nMOS field-effect transistor and a gate structure of an pMOS field-effect transistor (i.e. the semiconductor device of FIGS. 4A-4L includes a CMOS field-effect transistor).

As shown in FIG. 4A, the recess 104 includes a first recess 104a for the pMOS field-effect transistor and a second recess 104b for the nMOS field-effect transistor. The recess 104 may include recesses remaining in the substrate 100 after removal of one or more dummy gates previously formed in the recesses.

Figure 4B:
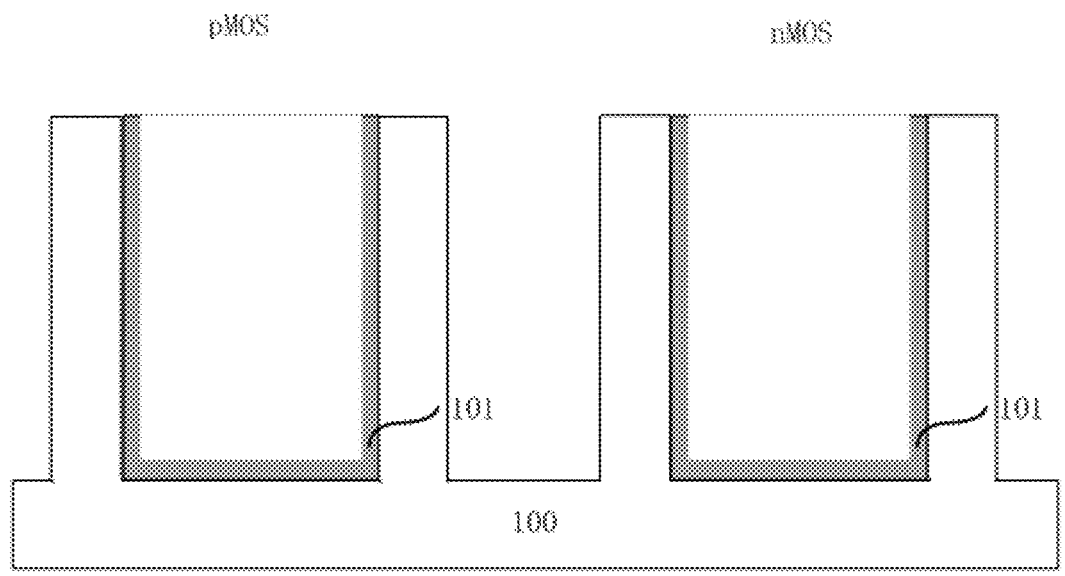

As shown in FIG. 4B, a gate insulating layer 101 is formed on an inner wall of the recess 104 of the substrate 100. Reference may be made to the description of the embodiment shown in FIG. 1 for the materials contained in the gate insulating layer 101 and the formation method thereof. The substrate 100 may be, for example, a silicon substrate.

Next, as shown in FIGS. 4C-4G, a work function material layer 102 is formed on the gate insulating layer 101. As previously described, if the semiconductor device includes gate structures of a CMOS field-effect transistor, the work function material layer 102 may include a first work function material layer 102a for the pMOS field-effect transistor and a second work function material layer 102b for the nMOS field-effect transistor.

Figure 4C:
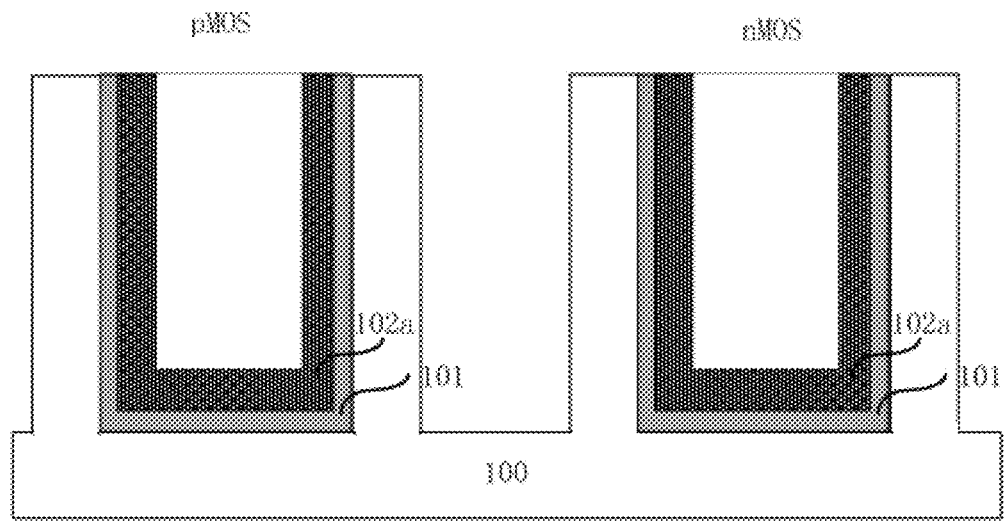

As shown in FIG. 4C, the first work function material layer 102a is formed on the gate insulating layers 101 in the first recess 104a and the second recess 104b. The first work function material layer 102a may include a work function material for a pMOS field-effect transistor, and the work function material may include, for example, TiN or Ta compounds. The first work function material 102a may be formed so as to apply a compressive stress to the channel of the pMOS field-effect transistor. Reference may be made to the previous description of the embodiment shown in FIG. 1 for a formation method of the first work function material layer 102a.

Figure 4D:
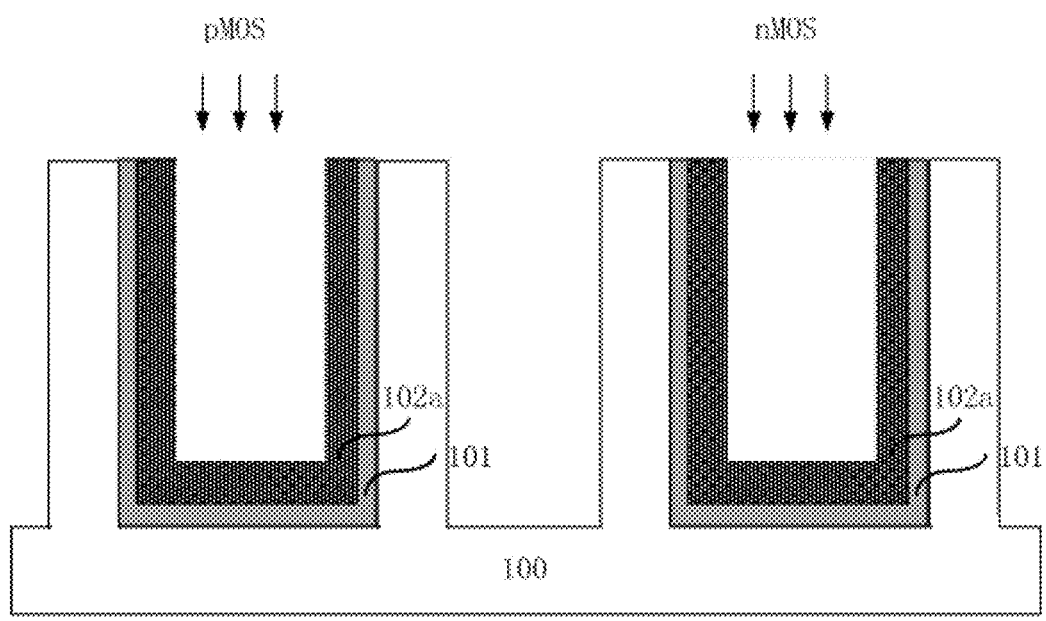

As shown in FIG. 4D, ion implantation is performed on the first work function material layer 102a so as to increase the compressive stress applied to the channel. In some embodiments, the ion implantation dosage may vary between $10^{15}/cm^2$ to $10^{17}/cm^2$, and the implantation energy may vary between 100 eV (0.1 keV) to 500000 eV (500 keV). The implanted ions may include, for example, ions of elements such as aluminium (Al), barium (Ba), chromium (Cr), cobalt (Co), hafnium (Hf), iridium (Ir), iron (Fe), lanthanum (La) and other lanthanum series elements, molybdenum (Mo), niobium (Nb), osmium (Os), palladium (Pd), platinum (Pt), rhenium (Re), ruthenium (Ru), rhodium (Rh), scandium (Sc), strontium (Sr), tantalum (Ta), titanium (Ti), tungsten (W), vanadium (V), yttrium (Y), zinc (Zn), zirconium (Zr), nitrogen (N), xenon (Xe), argon (Ar), neon (Ne), krypton (Kr), niton (Rn), or carbon (C). In some embodiments, the ion implantation step of FIG. 4D may be an optional step in the manufacture of the semiconductor device.

Figure 4E:
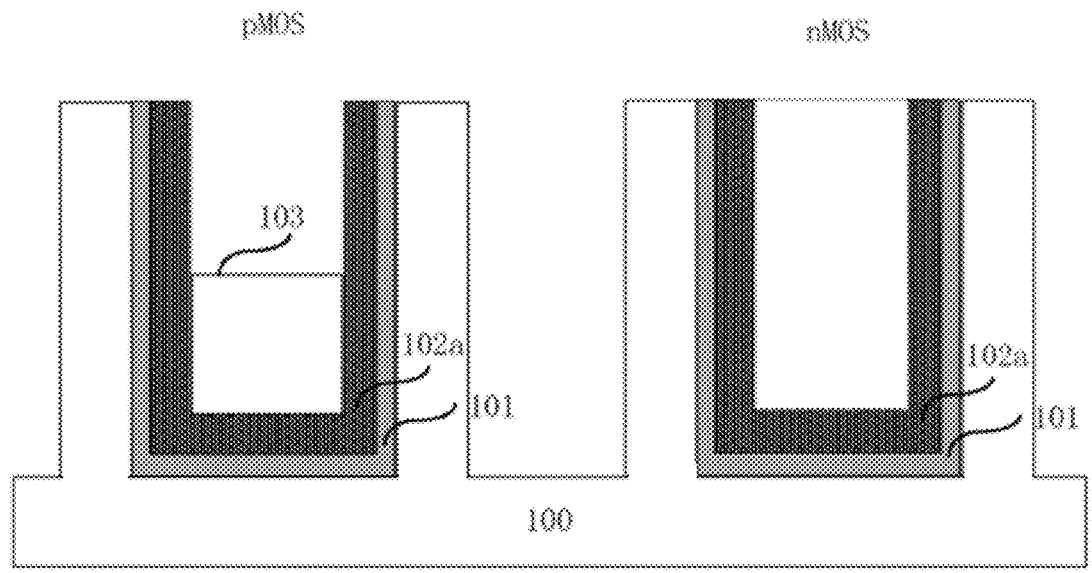

As shown in FIG. 4E, a mask 103 is formed over the bottom of the first work function material layer 102a in the first recess 104a. The mask 103 allows unmasked areas to be selectively etched. The mask 103 may be formed of, for example, a photoresist material.

Figure 4F:
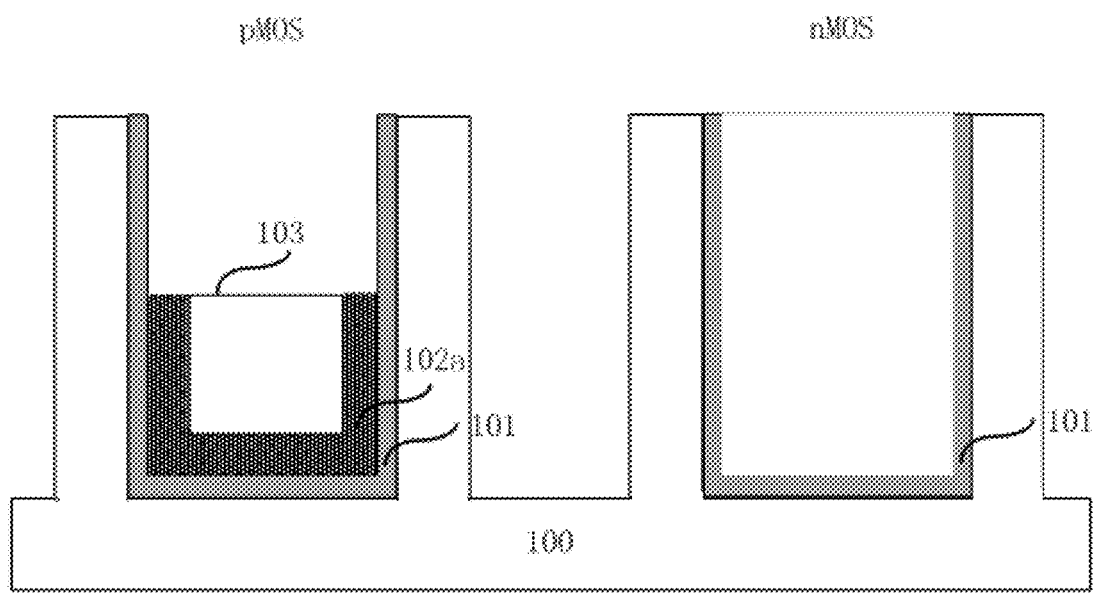

Next, as shown in FIG. 4F, an upper portion of the first work function material layer 102a in the first recess 104a, and the first work function material layer 102a in the second recess 104b, are etched using known semiconductor processing techniques such as dry etching.

Figure 4G:
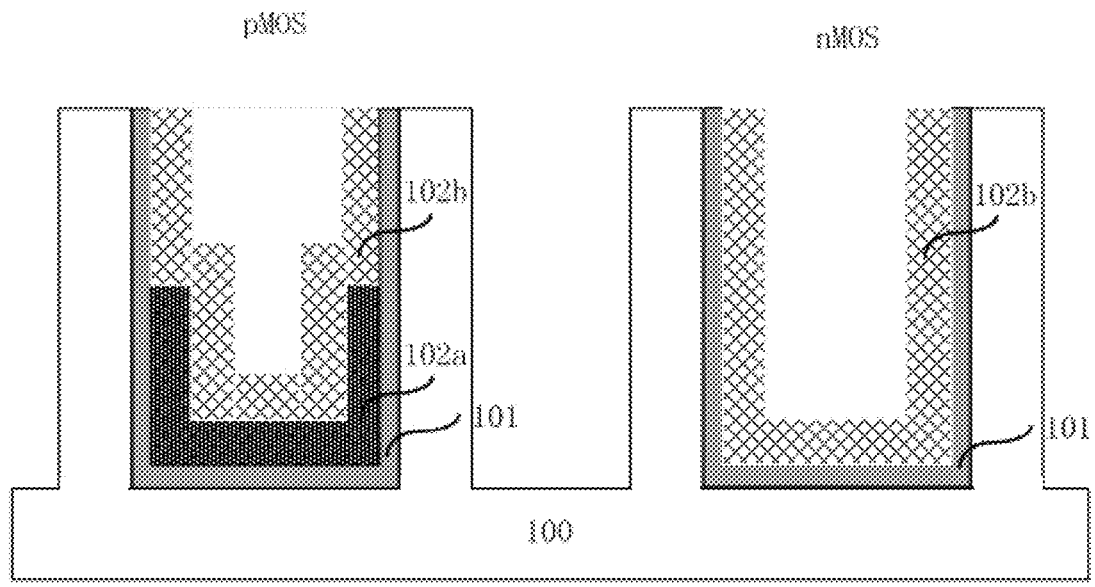

As shown in FIG. 4G, a second work function material layer 102b is formed on the etched structure remaining in the first recess 104a and the second recess 104b. The second work function material layer 102b may include a work function material layer for an nMOS field-effect transistor, and the work function material may include, for example, TiAlN, a metal carbide, or a metal oxycarbide. The second work function material layer 102b may be formed so as to apply a tensile stress to the channel of the nMOS field-effect transistor. Reference may be made to the previous description of the embodiment shown in FIG. 1 for the formation method of the second work function material layer 102b.

Figure 4H:
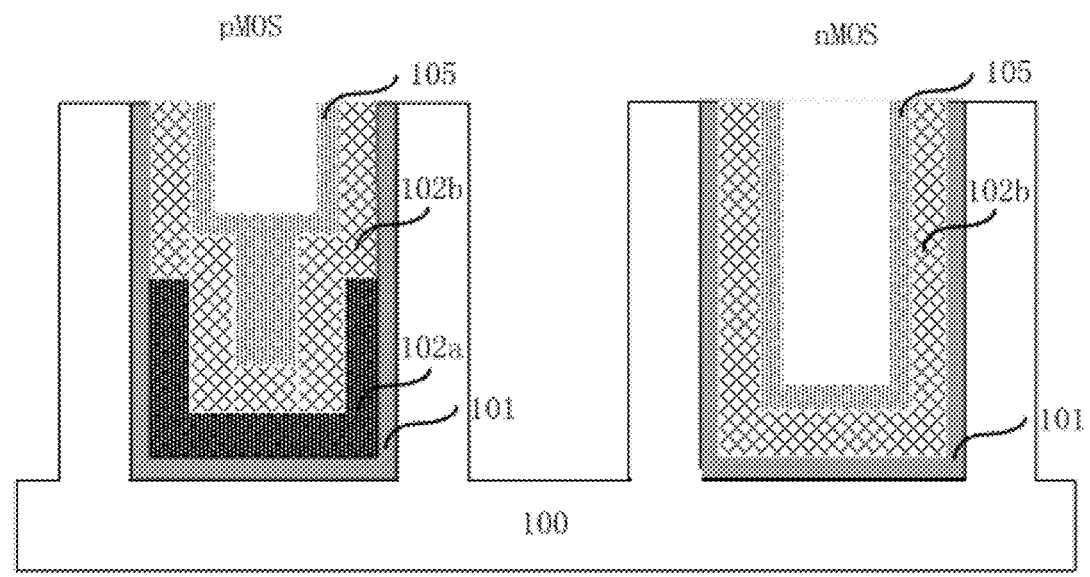

Next, as shown in FIG. 4H, a barrier layer 105 is formed on the second work function material layer 102b. The barrier layer 105 can prevent subsequently deposited materials from diffusing into the second work function material layer 102b. The barrier layer 105 may be formed of, for example, TiN or TaN. The barrier layer 105 may be formed using deposition methods such as CVD or ALD. The barrier layer 105 may be formed so as to apply a low stress. In some embodiments, the formation of the barrier layer 105 may be an optional step in the manufacture of the semiconductor device.

Figure 4K:
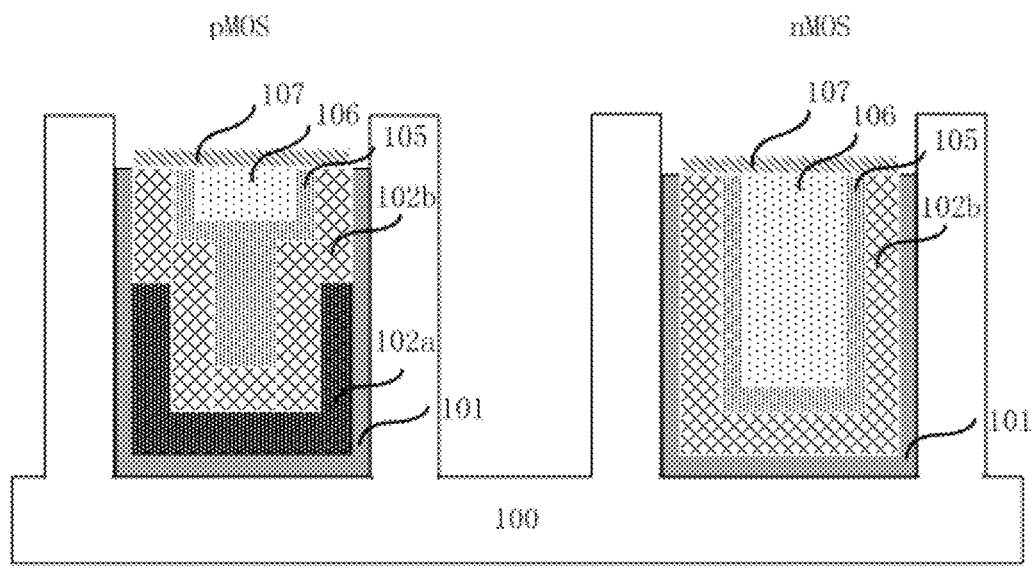
Figure 4L:
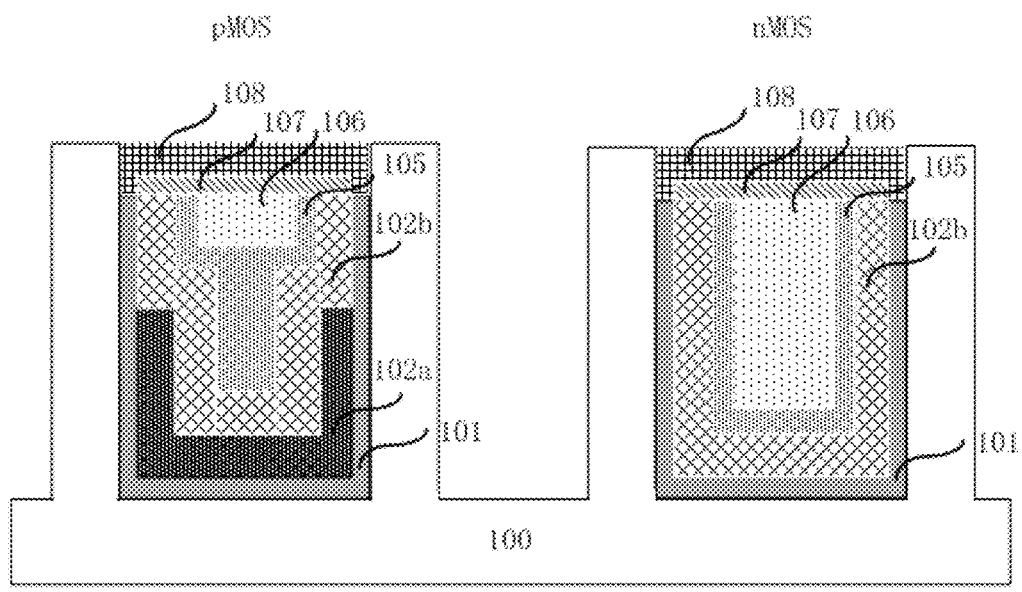
Figure 4I:
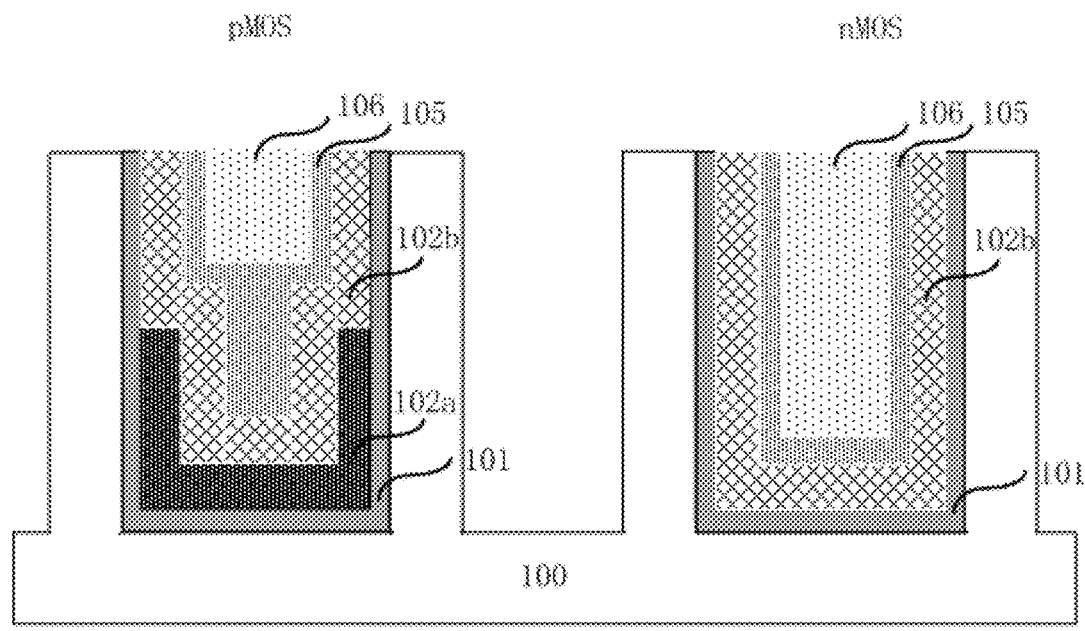

Next, as shown in FIG. 4I, a gate metal 106 is deposited on the barrier layer 105. The gate metal 106 may be formed so as to apply a tensile stress to the channel of the nMOS field-effect transistor. Referring to FIG. 4I, the gate metal 106 in the first recess 104a is shown located further away from the channel of the nMOS field-effect transistor than the gate metal 106 in the second recess 104b. As a result, the tensile stress applied to the channel of the nMOS field-effect transistor is primarily due to the gate metal 106 in the second recess 104b. Reference may be made to the previous description of the embodiment shown in FIG. 1 for the material contained in the gate metal 106 and the formation method thereof.

With reference to the gate structure of the pMOS field-effect transistor shown in FIG. 4I, the compressive stress applied to the channel of the pMOS field-effect transistor is primarily generated by the first work function material layer 102a in the first recess 104a located nearest to the channel of the pMOS field-effect transistor. Although both the second work function material layer 102b and the gate metal 106 generate a tensile stress in opposition to the compressive stress applied by the first work function material layer 102a, the second work function material layer 102b and the gate metal 106 are separated from the channel of the pMOS field-effect transistor by the first work function material layer 102a, and are located further away from the channel of the pMOS field-effect transistor than the first work function material layer 102a. As a result, the compressive stress applied to the channel of the pMOS field-effect transistor by the first work function material layer 102a dominates over the tensile stress applied by the second work function material layer 102b and the gate metal 106 to the channel of the pMOS field-effect transistor.

With reference to the gate structure of the nMOS field-effect transistor shown in FIG. 4I, the tensile stress applied to the channel of the nMOS field-effect transistor is primarily generated by the second work function material layer 102b and/or the gate metal 106 located nearest to the channel of the nMOS field-effect transistor.

Figure 4J:
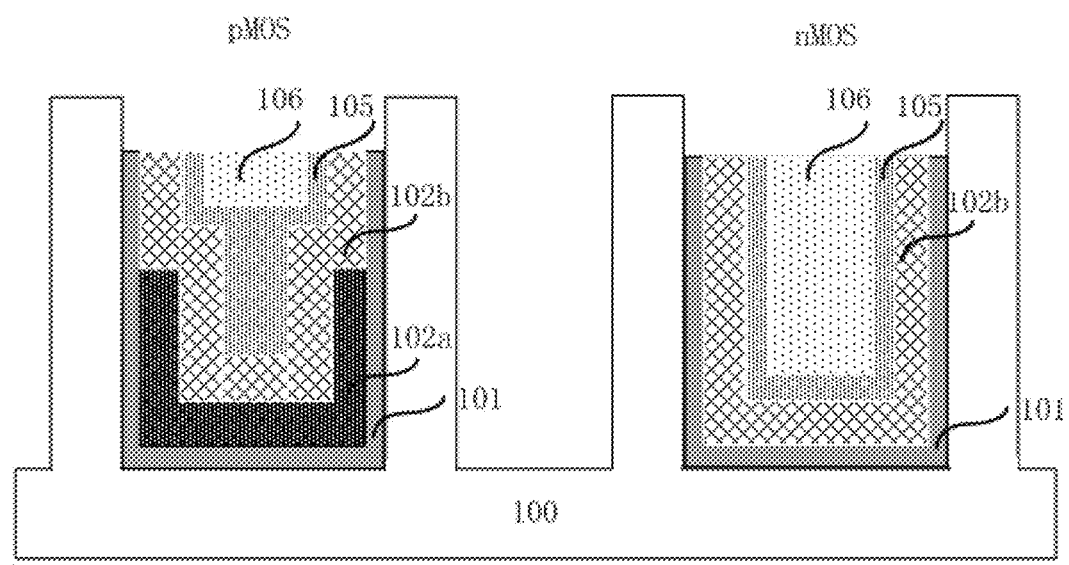

As shown in FIG. 4J, chemical-mechanical planarization/polishing (CMP) is performed prior to depositing a second metal layer 107 (shown in FIG. 4K). The purpose of the CMP is to planarize a surface formed by the gate metal 106, the barrier layer 105, the second work function material layer 102b, and the gate insulating layer 101. In some embodiments, the CMP of FIG. 4J may be an optional step in the manufacture of the semiconductor device.

Next, as shown in FIG. 4K, a second metal layer 107 is deposited on a planar surface common to the gate metal 106, the barrier layer 105, and the second work function material layer 102b, so as to reduce contact resistance of the gate structures. The second metal layer 107 may be formed of, for example, TiAl, Al, TiAlN, Ti, or TiW. The second metal layer 107 may be formed using deposition methods such as CVD or ALD. In some embodiments, the second metal layer 107 may be optionally formed.

Lastly, as shown in FIG. 4L, an insulating material 108 is used to fill a gap of the recesses 104a and 104b. The insulating material may include, for example, a mixture of SiN and SiON, a mixture of SiN and SiOCN, a mixture of SiON and SiOCN, or SiON or other similar insulating materials. In some embodiments, the filling of the gap with the insulating material 108 may be optional.

The steps described with reference to FIGS. 4A-4L may be performed in series or in parallel to form gate structures for the pMOS field-effect transistor and the nMOS field-effect transistor of a CMOS field-effect transistor. As previously described, the gate material of the pMOS field-effect transistor may apply a compressive stress to the channel of the pMOS field-effect transistor, and the gate material of the nMOS field-effect transistor may apply a tensile stress to the channel of the nMOS field-effect transistor. Thus, carrier mobilities of the pMOS field-effect transistor and nMOS field-effect transistor can be increased using the above-described gate materials.

Next, a method for manufacturing a semiconductor device according to another embodiment of the present disclosure will be described with reference to FIGS. 5A-5I.

In contrast to the embodiment described with reference to FIGS. 4A-4L, the embodiment described with reference to FIGS. 5A-5I includes a protection layer 501 formed between the gate insulating layer and the work function material layer, for protecting the gate insulating layer containing the high-k material. Additionally, an etching stop layer 502 may be formed on the protection layer 501 to protect the protection layer 501 from damage during the etching process. Although the semiconductor device of FIGS. 5A-5I includes a CMOS field-effect transistor, one of ordinary skill in the art would readily appreciate that the processes for forming the protection layer 501 and the etching stop layer 502 may be separately applied for a stand-alone nMOS field-effect transistor or a stand-alone pMOS field-effect transistor.

Figure 5A:
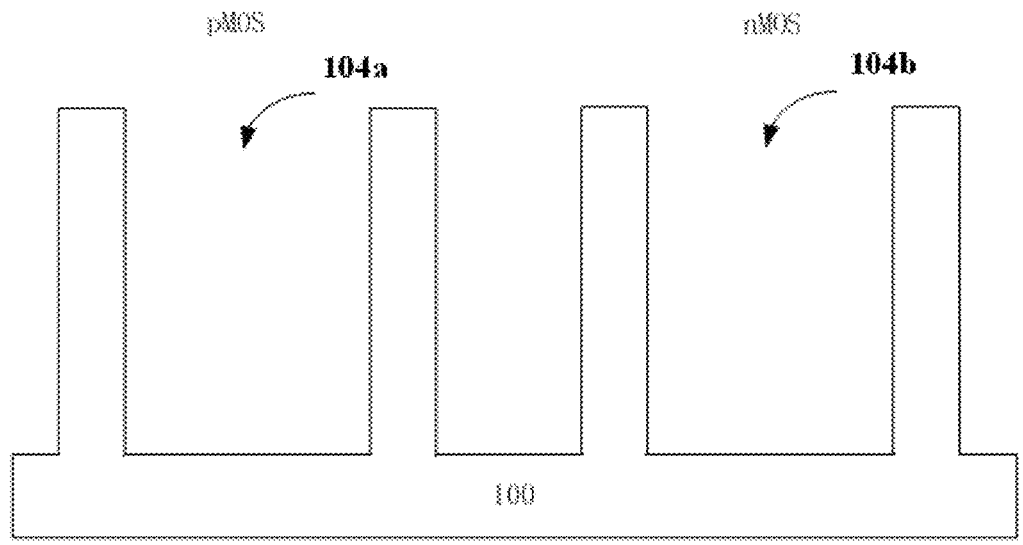
FIGS. 5A-5I show cross-sectional views of various stages of a method for manufacturing a semiconductor device according to another embodiment of the present disclosure.

As shown in FIG. 5A, the recess 104 of the substrate 100 includes a first recess 104a for the pMOS field-effect transistor and a second recess 104b for the nMOS field-effect transistor. The substrate 100 may be, for example, a silicon substrate.

Figure 5B:
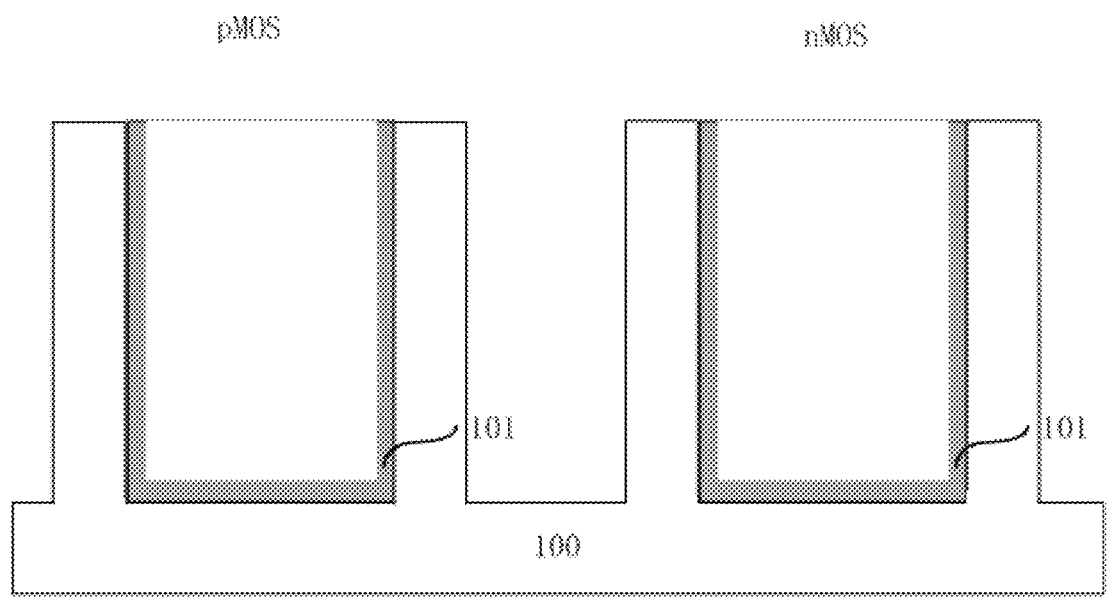

As shown in FIG. 5B, a gate insulating layer 101 is formed on an inner wall of the recess 104 of the substrate 100. Reference may be made to the previous description of the embodiment shown in FIG. 1 for the materials contained in the gate insulating layer 101 and the formation method thereof.

Figure 5C:
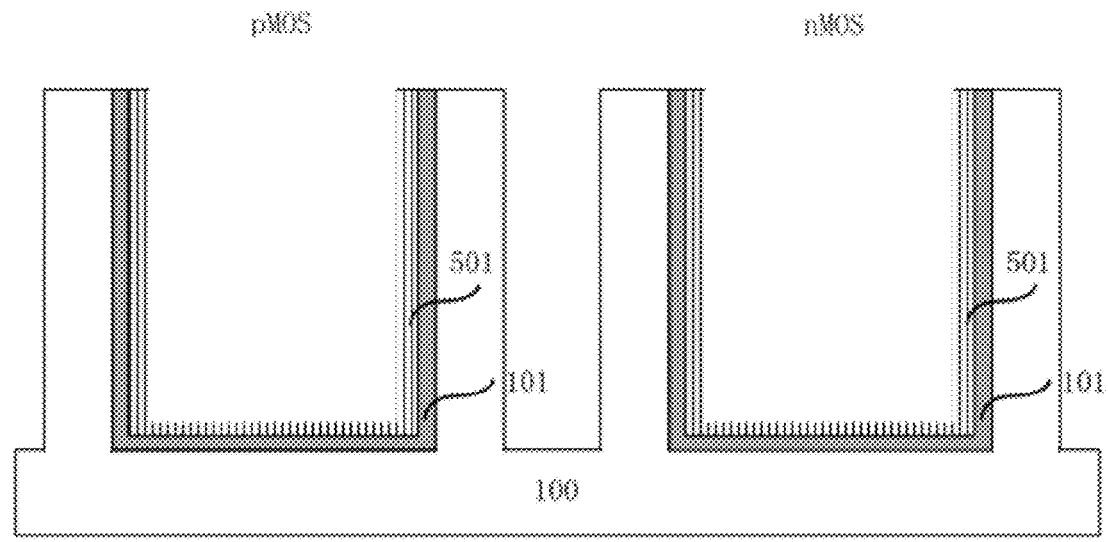

Next, as shown in FIG. 5C, a protection layer 501 is formed on the gate insulating layer 101 to protect the gate insulating layer 101 from damage during subsequent processes such as etching and oxidation. The protection layer 501 may apply a compressive stress to the channel of the pMOS field-effect transistor. The protection layer 501 may be formed of, for example, TiN, using deposition methods such as ALD. For example, a protection layer 501 comprising TiN may be deposited using gases such $NH_3$ and $TiCl_4$, at a pressure of 0.1 Torr and temperature of 450° C.

Figure 5D:
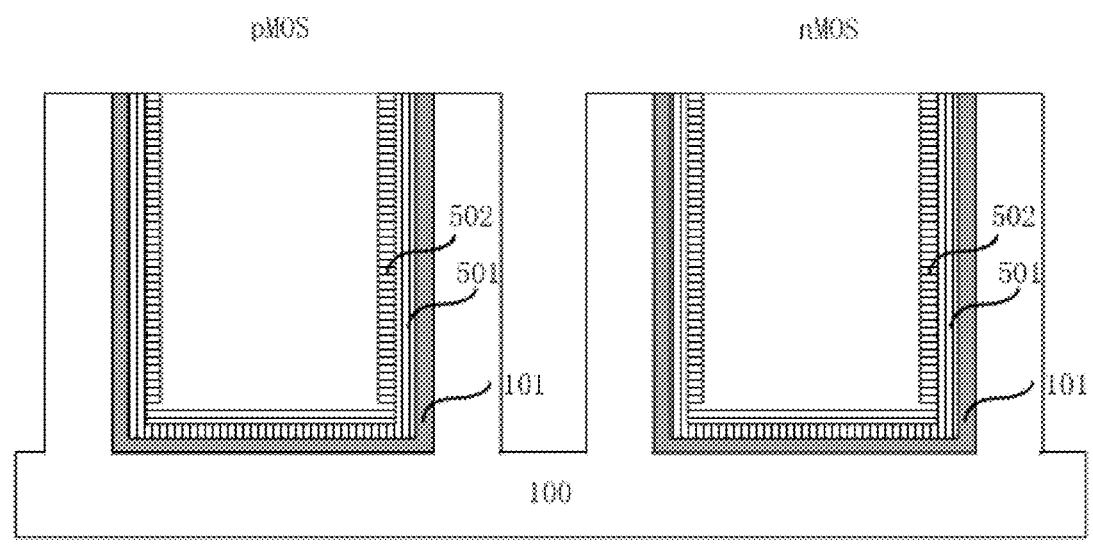

Next, as shown in FIG. 5D, an etching stop layer 502 is formed on the protection layer 501. The etching stop layer 502 can protect the protection layer 501 from damage during subsequent etching processes. The etching stop layer 502 may be formed of, for example, TaAl, using deposition methods such as ALD. For example, an etching stop layer 502 comprising TaAl may be deposited using gases such as $Ta(OC_2H_5)_5$ (tantalum ethoxide) or aluminium trimethide, at a pressure of 0.1 Torr and temperature of 450° C. In some embodiments, the etching stop layer 502 may be optionally formed.

Next, as shown in FIGS. 5E-5I, the work function material layer 102 is formed. As previously described, if the semiconductor device includes gate structures for a CMOS field-effect transistor, the work function material layer 102 may include a first work function material layer 102a and a second work function material layer 102b.

Figure 5E:
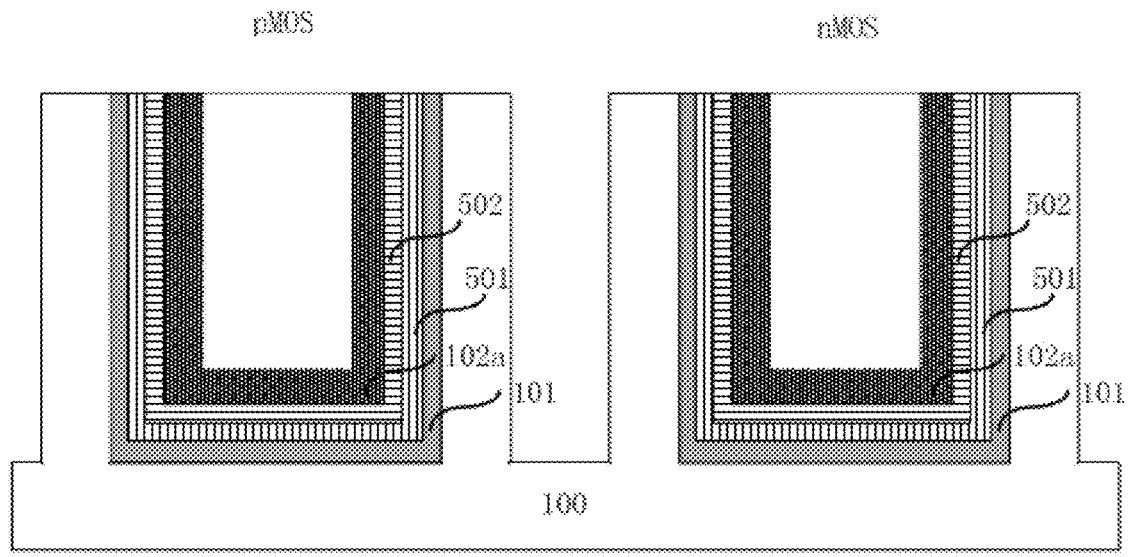

As shown in FIG. 5E, the first work function material layer 102a is formed on the etching stop layer 502. The first work function material layer 102a includes a work function material for a pMOS field-effect transistor, and the work function material may include, for example, TiN or Ta compounds. The first work function material layer 102a may apply a compressive stress to the channel of the pMOS field-effect transistor. Reference may be made to the previous description of the embodiment shown in FIG. 1 for the formation method of the first work function material layer 102a.

Figure 5F:
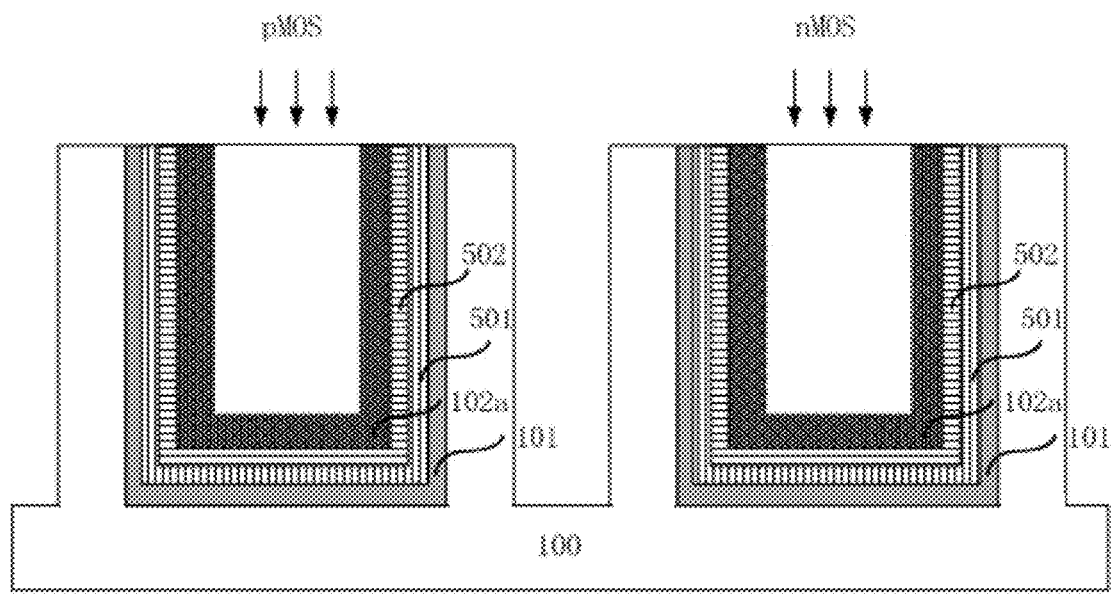

As shown in FIG. 5F, ion implantation is performed on the first work function material layer 102a so as to increase the applied compressive stress. Reference may be made to the previous description of the embodiment shown in FIG. 4D for examples of the implanted ions and the ion implantation method. In some embodiments, the ion implantation of FIG. 5F may be an optional step in the manufacture of the semiconductor device.

Figure 5G:
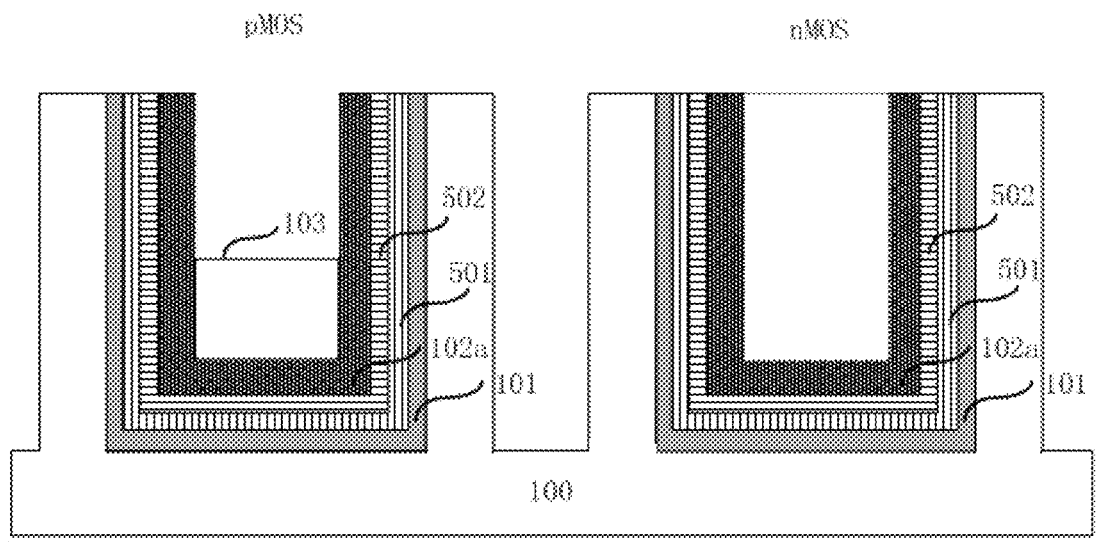

As shown in FIG. 5G, the bottom of the first work function material layer 102a in the first recess 104a is next covered by a mask 103. The mask 103 can allow unmasked areas to be selectively etched during an etching process. The mask 103 may be formed of, for example, a photoresist material.

Figure 5H:
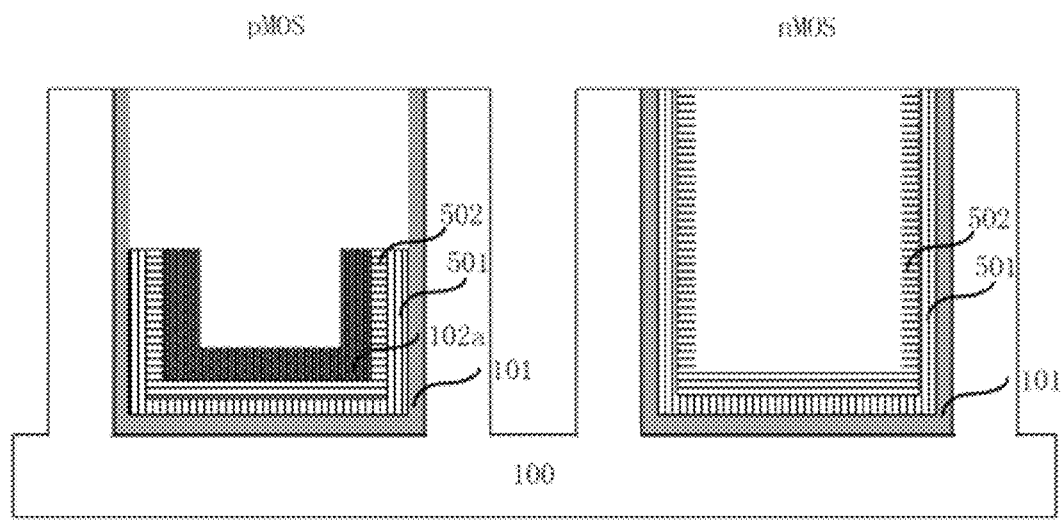

As shown in FIG. 5H, an upper portion of the first work function material layer 102a, the etching stop layer 502, and the protection layer 501 in the first recess 104a are etched, and the first work function material layer 102a in the second recess 104b is etched. As previously described, the etching may be implemented using known techniques such as dry etching. During the etching process, the etching stop layer 502 can protect the protection layer 501 from damage.

Figure 5I:
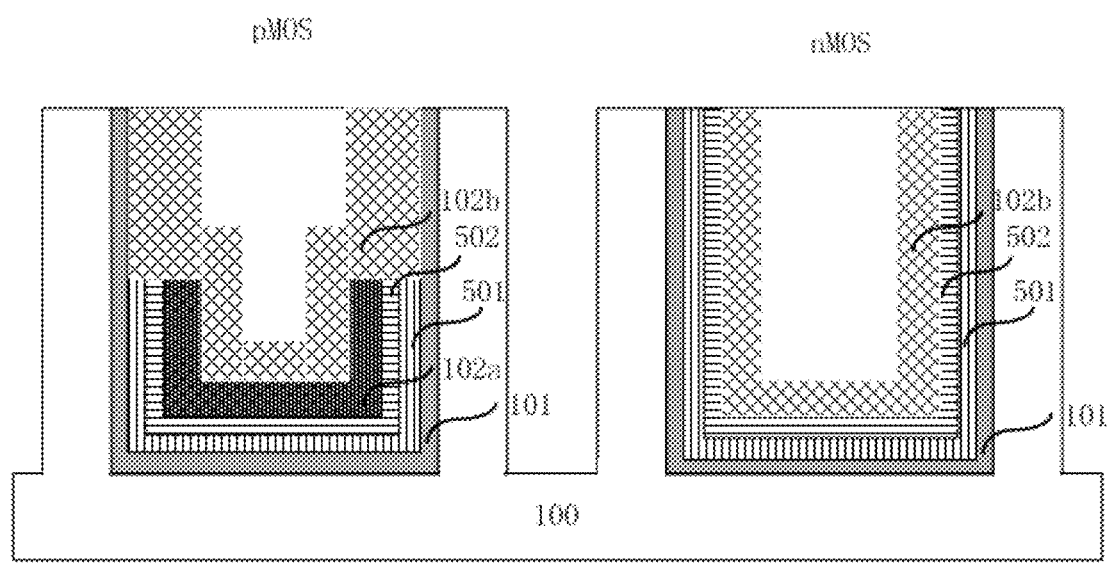

As shown in FIG. 5I, the second work function material layer 102b is formed on the first recess 104a and the second recess 104b. The second work function material layer 102b includes a work function material for an nMOS field-effect transistor, and the work function material may include, for example, TiAlN, a metal carbide, or a metal oxycarbide. The second work function material layer 102b may apply a tensile stress to the channel of the nMOS field-effect transistor. Reference may be made to the previous description of the embodiment shown in FIG. 1 for the formation method of the second work function material layer 102b.

After the second work function material layer 102b has been formed, the steps of forming the barrier layer 105 and the gate metal 106, performing chemical-mechanical polishing/planarization, forming the second metal layer 107, and filling the gaps of the recess with insulating material 108 may be carried out using, for example, the method previously described with reference to FIGS. 4H-4L.

As previously described, the protection layer 501 may apply a compressive stress to the channel of the nMOS field-effect transistor. However, the second work function material layer 102b and the gate metal 106 may both apply a tensile stress to the channel of the nMOS field-effect transistor. Additionally, the gate metal 106 may be relatively thick (compared to the protection layer 501) such that the tensile stress applied by the gate metal 106 to the channel of the nMOS field-effect transistor dominates over the compressive stress applied by the protection layer 501.

In the embodiment described with reference to FIGS. 5A-5I, the gate insulating layer 101 containing high-k material may be further protected so as to improve the reliability and performance of the semiconductor device.

Various embodiments of the present disclosure have been described above with reference to FIGS. 1-3, FIGS. 4A-4L, and FIGS. 5A-5I. Although the figures illustrate forming the field-effect transistor of a planar structure, the above-described embodiments are likewise applicable to the field-effect transistor of a Fin structure (FinFET) for solving the problem of reduced carrier mobility in the Fin structure. Since the structure and processes for the planar structure and the Fin structure share similar aspects that are known and understood by one of ordinary skill in the art, descriptions of the field-effect transistor of the Fin structure and the manufacturing process thereof will not be described in the present disclosure. Nevertheless, the present invention includes the embodiments for the field-effect transistor of a planar structure as well as embodiments for the field-effect transistor of a Fin structure.

The method and the semiconductor device of the present disclosure may be realized in different ways, as one of ordinary skill in the art would appreciate. The above sequences of the steps of the disclosed methods are merely illustrative, and the present invention is not limited to the described sequences unless specifically stated otherwise.

The above-described embodiments are not intended to limit the present invention, and any modifications, equivalent replacements, or improvements made within the spirit and principle of the present invention fall within the scope of the present invention.

What is claimed is:

1. A semiconductor device, comprising:
   a gate insulating layer selectively formed on an inner wall of a silicon substrate recess;
   a work function material layer directly formed on the gate insulating layer so as to apply a tensile stress or a compressive stress to a channel of a MOS field-effect transistor;
   a gate metal formed on the work function material layer; and
   a barrier layer formed between the work function material layer and the gate metal.

2. The semiconductor device according to claim 1 further comprising a gate structure of an nMOS field-effect transistor, and the work function material layer comprises a first work function material layer for applying a tensile stress to a channel of the nMOS field-effect transistor.

3. The semiconductor device according to claim 1 further comprising a gate structure of a pMOS field-effect transistor, and the work function material layer comprises a second work function material layer for applying a compressive stress to a channel of the pMOS field-effect transistor.

4. The semiconductor device according to claim 1, further comprising:
   a second metal layer formed on a surface common to the work function material layer, the barrier layer, and the gate metal.

5. The semiconductor device according to claim 1, wherein the gate metal is formed so as to apply a tensile stress to the channel.

6. The semiconductor device according to claim 1, further comprising:
   a protection layer formed between the gate insulating layer and the work function material layer so as to protect the gate insulating layer.

7. A semiconductor device having a gate structure of an nMOS field-effect transistor, the semiconductor device comprising:
   a gate insulating layer selectively formed on an inner wall of a silicon substrate recess;
   a work function material layer directly formed on the gate insulating layer; and
   a gate metal formed on the work function material layer so as to apply a tensile stress to a channel of the nMOS field-effect transistor; and
   a barrier layer formed between the work function material layer and the gate metal.

8. The semiconductor device according to claim 7, further comprising:
   a second metal layer formed on a surface common to the work function material layer, the barrier layer, and the gate metal.

9. The semiconductor device according to claim 7, wherein the work function material layer is formed so as to apply a tensile stress to the channel, and the work function material layer includes TiAlN, a metal carbide, or a metal oxycarbide.

10. The semiconductor device according to claim 7, further comprising:
    a protection layer formed between the gate insulating layer and the work function material layer so as to protect the gate insulating layer.

11. A method for manufacturing a semiconductor device, comprising:
    selectively forming a gate insulating layer on an inner wall of a silicon substrate recess of a MOS field-effect transistor;
    forming a work function material layer directly on the gate insulating layer so as to apply a tensile stress or a compressive stress to a channel of the MOS field-effect transistor;
    depositing a gate metal on the work function material layer, and
    forming a barrier layer between the work function material layer and the gate metal.

12. The method according to claim 11, wherein the semiconductor device includes a gate structure of an nMOS field-effect transistor, and forming the work function material layer so as to apply a tensile stress to a channel of the nMOS field-effect transistor.

13. The method according to claim 11, wherein the semiconductor device includes a gate structure of a pMOS field-effect transistor, and forming the work function material layer so as to apply a compressive stress to a channel of the pMOS field-effect transistor.

14. The method according to claim 11, wherein the semiconductor device includes a gate structure of a CMOS field-effect transistor, and the substrate recess includes a first recess for a pMOS field-effect transistor and a second recess for an nMOS field-effect transistor; and
    forming the work function material layer on the gate insulating layer comprises:
        forming a first work function material layer for the pMOS field-effect transistor on respective gate insulating layers of the first recess and the second recess, so as to apply a compressive stress to the channel;

etching off an upper portion of the first work function material layer in the first recess and the first work function material layer in the second recess; and forming a second work function material layer for the nMOS field-effect transistor in the first recess and the second recess, so as to apply a tensile stress to the channel.

15. The method according to claim 11, wherein forming the work function material layer on the gate insulating layer comprises:

depositing a first work function material on the gate insulating layer; and performing ion implantation on the first work function material so as to increase the applied compressive stress.

16. The method according to claim 11, further comprising forming the gate metal so as to apply a tensile stress to the channel.

17. The method according to claim 11, further comprising:

removing a portion of the work function material layer, the barrier layer, and the gate metal;

forming a second metal layer on a surface common to the work function material layer, the barrier layer, and the gate metal, so as to reduce contact resistance; and depositing an insulator on the gate insulating layer and the second metal layer.

18. The method according to claim 11, wherein forming the work function material layer on the gate insulating layer comprises:

forming a protection layer on the gate insulating layer; and forming the work function material layer on the protection layer.

19. A method for manufacturing a semiconductor device having a gate structure of an nMOS field-effect transistor, the method comprising:

selectively forming a gate insulating layer on an inner wall of a silicon substrate recess of the nMOS field-effect transistor;

forming a work function material layer directly on the gate insulating layer; and depositing a gate metal on the work function material layer so as to apply a tensile stress to a channel of the nMOS field-effect transistor, and forming a barrier layer between the work function material layer and the gate metal.

20. The method according to claim 19, wherein forming the work function material layer on the gate insulating layer comprises:

forming a protection layer on the gate insulating layer; and forming the work function material layer on the protection layer.

* * * * *